(12) United States Patent
Fang et al.

(10) Patent No.: US 12,368,070 B2
(45) Date of Patent: Jul. 22, 2025

(54) LDMOS DEVICE HAVING ISOLATION REGIONS COMPRISING DTI REGIONS EXTENDING FROM A BOTTOM OF STI REGION

(71) Applicant: TAIWAN SEMICONDUCTOR MANUFACTURING CO., LTD., Hsinchu (TW)

(72) Inventors: Chun-Chieh Fang, Chiayi County (TW); Chien-Chang Huang, Tainan (TW); Chi-Yuan Wen, Tainan (TW); Jian Wu, Shanghai (CN); Ming-Chi Wu, Kaohsiung (TW); Jung-Yu Cheng, Tainan (TW); Shih-Shiung Chen, Tainan (TW); Wei-Tung Huang, Tainan (TW); Yu-Lung Yeh, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 336 days.

(21) Appl. No.: 17/694,380

(22) Filed: Mar. 14, 2022

(65) Prior Publication Data
US 2022/0199459 A1 Jun. 23, 2022

Related U.S. Application Data

(62) Division of application No. 14/742,550, filed on Jun. 17, 2015, now abandoned.

(51) Int. Cl.
*H01L 29/78* (2006.01)
*H01L 21/308* (2006.01)
(Continued)

(52) U.S. Cl.
CPC .... *H01L 21/76229* (2013.01); *H01L 21/3083* (2013.01); *H01L 21/76232* (2013.01);
(Continued)

(58) Field of Classification Search
CPC .......... H01L 29/66681; H01L 29/7816; H10D 30/0281; H10D 30/65
See application file for complete search history.

(56) References Cited

U.S. PATENT DOCUMENTS

| | | | |
|---|---|---|---|
| 4,472,240 A | 9/1984 | Kameyama | |
| 4,578,128 A | 3/1986 | Mundt | |

(Continued)

FOREIGN PATENT DOCUMENTS

| | | | |
|---|---|---|---|
| CN | 102237358 A | 11/2011 | |
| KR | 2001-0045231 A | 6/2001 | |

(Continued)

*Primary Examiner* — Anh D Mai
(74) *Attorney, Agent, or Firm* — Maschoff Brennan

(57) ABSTRACT

An LDMOS device comprises a well region, first and second implant regions, a gate electrode, first and second source/drain regions, a first STI region, and a first DTI region. The well region is in a substrate and of a first conductivity type. The first implant region is in the substrate and of a second conductivity type. The second implant region is in the well region and of the first conductivity type. The gate electrode extends from above the well region to above the first implant region. The first and second source/drain regions are respectively in the first and second implant regions. The first STI region laterally extends from the second implant region to directly below the gate electrode. The first DTI region extends downwards from a bottom surface of the first STI region into the well region. The first DTI region vertically overlaps with the gate electrode.

20 Claims, 12 Drawing Sheets

(51) Int. Cl.
*H01L 21/762* (2006.01)
*H10D 30/01* (2025.01)
*H10D 30/60* (2025.01)
*H10D 30/65* (2025.01)
*H10D 62/10* (2025.01)
*H01L 21/265* (2006.01)
*H10D 62/17* (2025.01)

(52) U.S. Cl.
CPC ..... *H10D 30/0221* (2025.01); *H10D 30/0281* (2025.01); *H10D 30/603* (2025.01); *H10D 30/65* (2025.01); *H10D 62/116* (2025.01); *H01L 21/2652* (2013.01); *H01L 21/26586* (2013.01); *H10D 62/307* (2025.01)

(56) References Cited

U.S. PATENT DOCUMENTS

| | | | |
|---|---|---|---|
| 4,808,550 A | 2/1989 | Fukushima | |
| 5,015,594 A | 5/1991 | Chu | |
| 6,140,156 A | 10/2000 | Tsai | |
| 6,169,007 B1 | 1/2001 | Pinter | |
| 6,204,131 B1 | 3/2001 | Shin | |
| 6,207,532 B1* | 3/2001 | Lin | H01L 21/76232 |
| | | | 257/E21.549 |
| 6,242,294 B1 | 6/2001 | Mitani | |
| 6,984,868 B2 | 1/2006 | Yoshihisa | |
| 7,723,178 B2* | 5/2010 | Adkisson | H01L 27/105 |
| | | | 438/294 |
| 8,294,236 B2 | 10/2012 | Mitsuhira et al. | |
| 8,536,648 B2* | 9/2013 | Shrivastava | H01L 29/7842 |
| | | | 257/335 |
| 2002/0063266 A1* | 5/2002 | Lee | H01L 29/66674 |
| | | | 257/E21.417 |
| 2003/0146468 A1 | 8/2003 | Gris | |
| 2003/0207525 A1 | 11/2003 | Trivedi | |
| 2004/0012068 A1 | 1/2004 | Iwata | |
| 2005/0064678 A1 | 3/2005 | Dudek et al. | |
| 2006/0001102 A1* | 1/2006 | Pendharkar | H01L 29/7816 |
| | | | 257/E29.063 |
| 2006/0252257 A1 | 11/2006 | Ahn et al. | |
| 2007/0132033 A1* | 6/2007 | Wu | H01L 21/823892 |
| | | | 257/500 |
| 2007/0194402 A1 | 8/2007 | Sandhu | |
| 2008/0057671 A1 | 3/2008 | Furukawa | |
| 2008/0265363 A1* | 10/2008 | Gambino | H01L 29/7835 |
| | | | 257/E21.549 |
| 2008/0268608 A1 | 10/2008 | Kim et al. | |
| 2009/0020812 A1* | 1/2009 | Cheng | H01L 29/0692 |
| | | | 257/E29.256 |
| 2009/0160009 A1 | 6/2009 | Dietz | |
| 2011/0147884 A1 | 6/2011 | Van Noort | |
| 2011/0260294 A1 | 10/2011 | Oh | |
| 2012/0104539 A1 | 5/2012 | Mehrotra | |
| 2013/0344678 A1 | 12/2013 | Oh | |
| 2014/0027848 A1* | 1/2014 | Strasser | H01L 29/7816 |
| | | | 438/286 |
| 2023/0238428 A1* | 7/2023 | Liou | H01L 21/76229 |
| | | | 257/343 |
| 2024/0405123 A1* | 12/2024 | Ku | H10D 64/111 |

FOREIGN PATENT DOCUMENTS

| | | |
|---|---|---|
| KR | 10-2010-0064106 A | 6/2010 |
| KR | 10-1002551 B1 | 12/2010 |
| KR | 2011-0117326 A | 10/2011 |

* cited by examiner

LDMOS DEVICE HAVING ISOLATION REGIONS COMPRISING DTI REGIONS EXTENDING FROM A BOTTOM OF STI REGION

PRIORITY CLAIM AND CROSS-REFERENCE

This application is a divisional application of U.S. patent application Ser. No. 14/742,550 filed on Jun. 17, 2015, which is herein incorporated by reference in its entirety.

BACKGROUND

With the development of communications technologies and electronic material technologies, communication devices, such as mobile devices and wearable electronic devices, have become more and more important in human's daily life. For example, the Internet of Things (IoT) acts as an infrastructure, in which objects, animals or people are provided with unique identifiers and the ability to exchanging data over a network. Among the IoT applications, wearable devices have the advantages of wearable characteristics and small size. An embedded flash integrated circuit may be applied to such wearable devices for minimizing device size. However, such embedded flash integrated circuit may generate a non-negligible leakage current that results in additional power consumption, and consequently shortening standby time of the wearable devices. How to reduce leakage current in small and concentrative integrated circuits has now become one of the major tasks in related industries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
FIG. 1A through FIG. 1H are schematic cross-sectional views of intermediate stages illustrating a method of forming a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Terms used herein are only used to describe the specific embodiments, which are not used to limit the claims appended herewith. For example, unless limited otherwise, the term "a", "an" or "the" of the single form may also represent the plural form.

The terms such as "first" and "second" are used for describing various elements, though such terms are only used for distinguishing one element from another element. Therefore, the first element may also be referred to as the second element without departing from the spirit of the claimed subject matter, and the others are deduced by analogy.

Embodiments of the present disclosure are directed to providing a semiconductor structure with a deep trench isolation (DTI). In such semiconductor structure, the DTI is formed below a shallow trench isolation (STI) and is substantially located between two adjacent well regions with different conductive types. Because of the DTI, the path of the leakage current flowing through the well regions is lengthened, such that the leakage current is reduced. Further, tilting variation of the ion implantation process due to cone angle effect can be neglected. The semiconductor structure of the present disclosure may be useful for such as memory integrated circuits, CMOS image sensors, temperature sensors, and/or the like. For example, the semiconductor structure of the present disclosure used in memory integrated circuits may help reduce power consumption or even improve reading/writing performance because read/write error due to excessive leakage current is reduced.

Referring to FIG. 1A to FIG. 1F, FIG. 1A to FIG. 1F illustrate schematic cross-sectional views of intermediate stages showing a method of forming a semiconductor device 100 in accordance with some embodiments of the present disclosure. In FIG. 1A, a semiconductor substrate 102 is provided. In some embodiments, the semiconductor substrate 102 includes such as silicon, bulk silicon, germanium or diamond. In another embodiments, the semiconductor substrate 102 may include a compound semiconductor such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. In addition, the semiconductor substrate 102 may be a bulk substrate or a silicon-on-insulator (SOI) substrate.

Figure 1B:
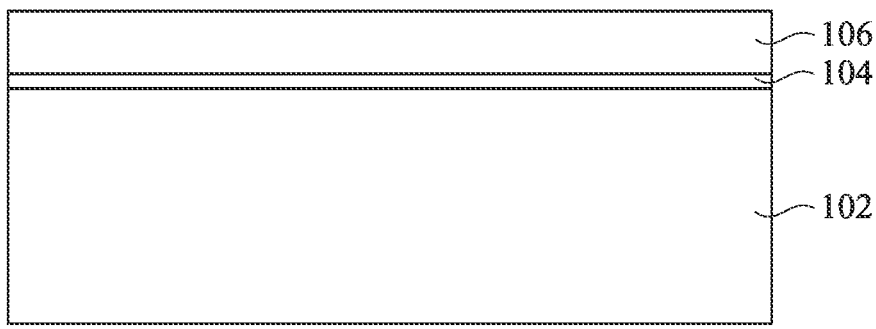

In FIG. 1B, a pad layer 104 is formed on the semiconductor substrate 102, and a barrier layer 106 is formed on the pad layer 104. The pad layer 104 includes such as silicon oxide, and the barrier layer 106 includes such as silicon nitride. In some embodiments, the pad layer 104 is formed by a process such chemical vapor deposition (CVD) process, thermal oxidation process, or another suitable process, and the barrier layer 106 is formed by a deposition process such as CVD process, low pressure CVD (LPCVD) process, plasma enhanced CVD (PECVD) process, or another suitable process.

Figure 1C:
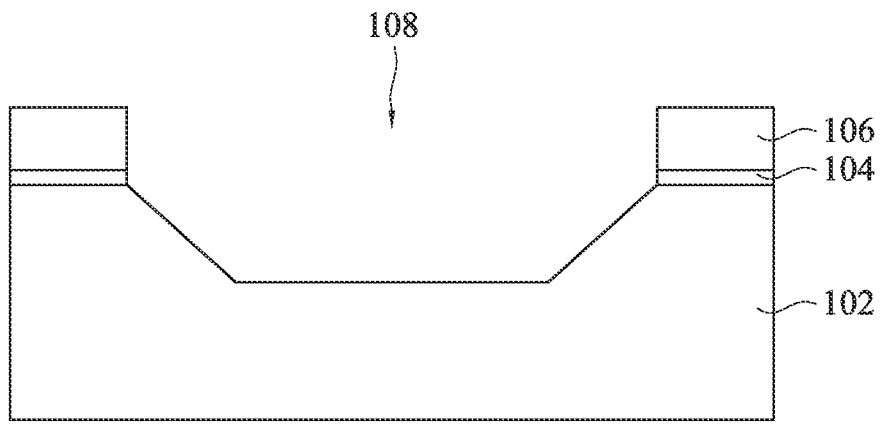

In FIG. 1C, an etching process is performed to etch the barrier layer 106, the pad layer 104 and the semiconductor substrate 102. In the etching process, a patterned photoresist layer (not shown) is used as a mask, so as to form a shallow trench 108 through the pad layer 104, the barrier layer 106 and a portion of the semiconductor substrate 102. In some embodiments, the etching process for forming the shallow trench 108 includes such as an anisotropic etching process, an isotropic etching process, or another suitable etching process. After the etching process, the patterned photoresist layer (not shown) is stripped.

Figure 1D:
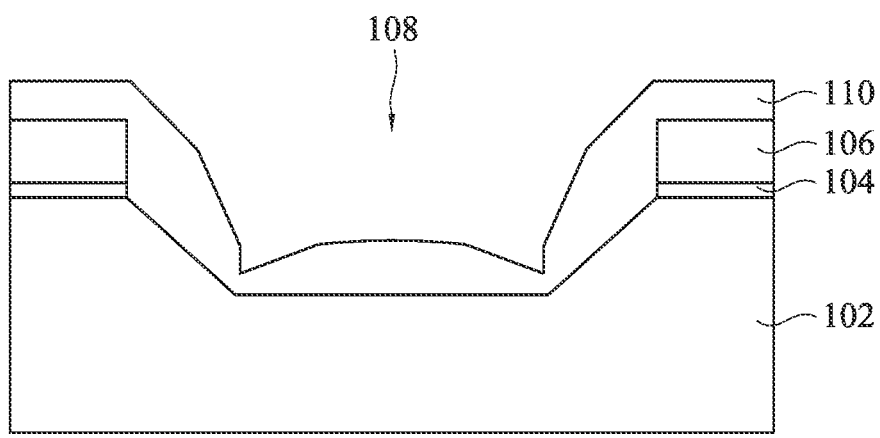

In FIG. 1D, a protective layer 110 is formed on the semiconductor substrate 102, the pad layer 104 and the barrier layer 106 for covering the shallow trench 108. The protective layer 110 may include a material such as silicon oxide, silicon nitride, silicon oxynitride, silicon carbide, combinations thereof, and/or the like. The protective layer 110 may be a hard mask layer, and may be a single-layer or multi-layer structure. In some embodiments, the protective layer 110 is a two-layer structure, which includes an oxide layer and a nitride layer on the oxide layer. The protective layer 110 is formed by using one or more deposition processes, such as CVD process, PECVD process, high density plasma (HDPCVD) process, physical vapor deposition (PVD) process, atomic layer deposition (ALD) process, thermal oxidation process, combinations thereof, and/or the like.

Figure 1E:
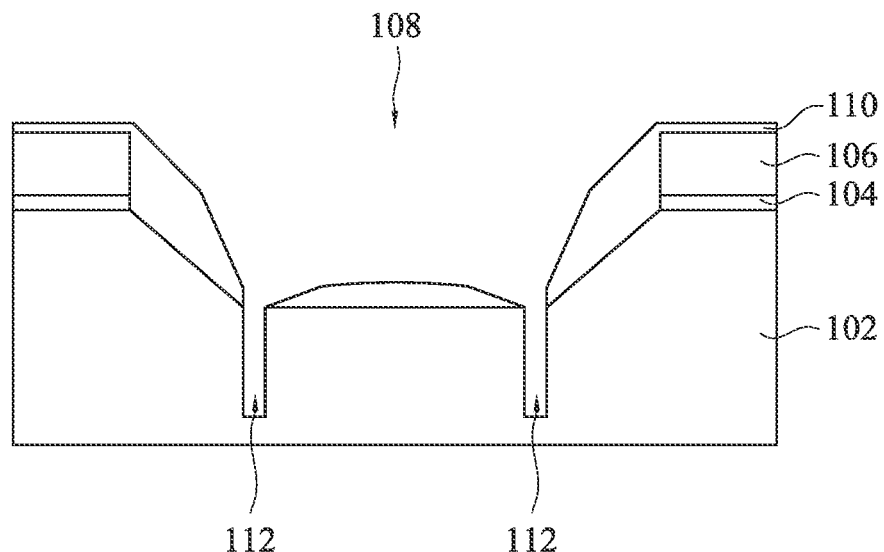

In FIG. 1E, a first etching process is performed to the protective layer 110. The first etching process is performed until at least a portion of a bottom surface of the shallow trench 108 is exposed by the protective layer 110. The first etching process is performed until at least a portion of a bottom surface of the shallow trench 108 is exposed by the protective layer 110. The first etching process may include such as a dry etching process, a wet etching process, a plasma etching process, a reactive ion etching (RIE) process, or another suitable etching process. As shown in FIG. 1E, the periphery area of the bottom surface of the shallow trench 108 is exposed. In various embodiments, the exposed area may be at center position of the bottom surface of the shallow trench 108, or another position, in accordance with various requirements. After the first etching process, a second etching process is then performed on the portion of the bottom surface of the shallow trench 108. The remained protective layer 110 acts as a photoresist for protecting the other portion of the shallow trench 108 from being etched. The second etching process may include such as a dry etching process, a wet etching process, a RIE process, or another suitable process. After the second etching process, a deep trench 112 is formed below the bottom surface of the shallow trench 108. The shape, width and location of the deep trench 112 may be determined by the pattern of the protective layer 110, and the thickness of the deep trench 112 may be determined by the time duration of the second etching process. In some embodiments, the deep trench 112 is formed having the thickness of at least 1000 angstroms.

Figure 1F:
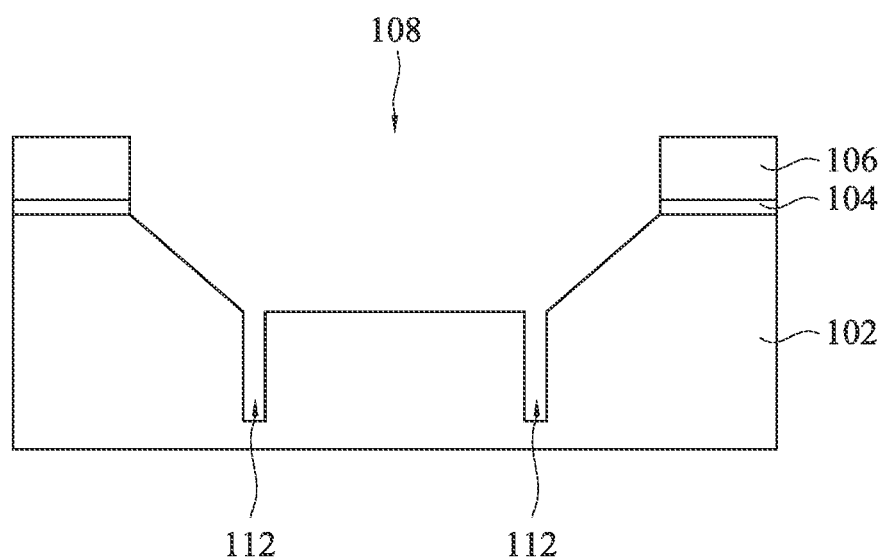
Figure 1G:
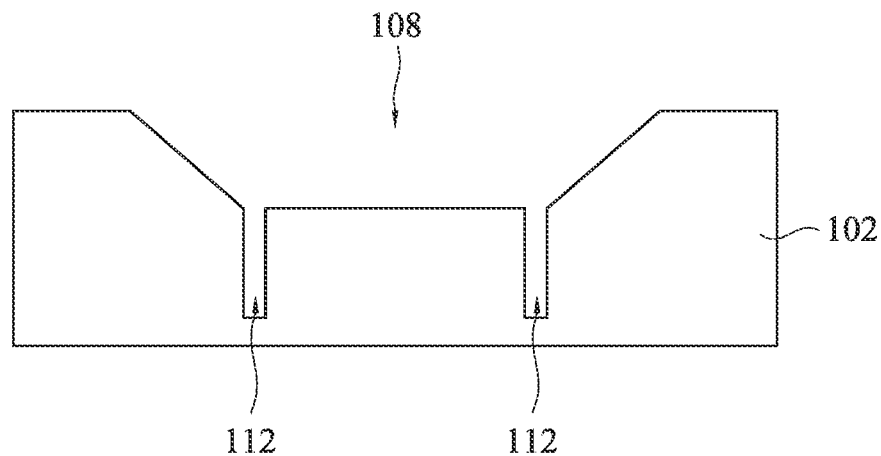

In FIG. 1F, after the deep trench 112 is formed, the remaining protective layer 110 is removed. Next, as shown in FIG. 1G, the barrier layer 106 and the pad layer 104 are removed. The removing process applied to the protective layer 110, the barrier layer 106 and the pad layer 104 may include one or more etching processes, such as wet etching process, dry etching process, combinations thereof, or another suitable process.

Figure 1H:
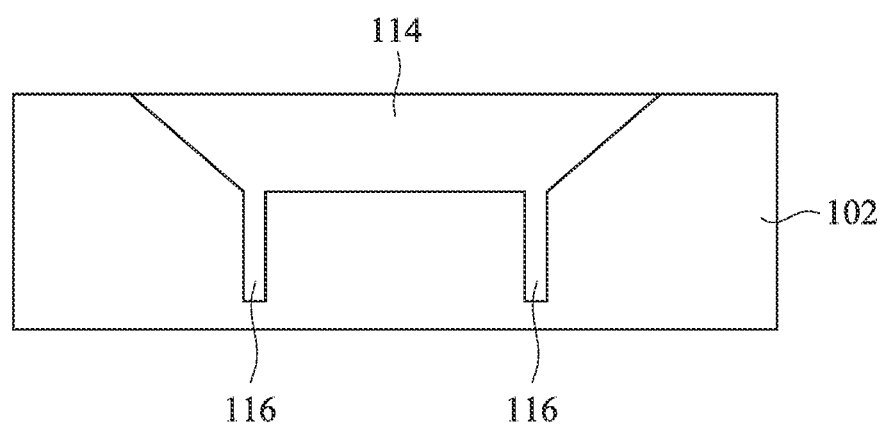

As shown in FIG. 1H in conjunction with FIG. 1G, the shallow trench 108 and the deep trench 112 are filled with an isolation oxide, so as to form a STI 114 and a DTI 116 respectively. In some embodiments, the isolation oxide includes a material such as silicon oxide, silicon dioxide, carbon doped silicon dioxide, nitrogen doped silicon dioxide, germanium doped silicon dioxide, phosphorus doped silicon dioxide, combinations thereof, or the like. In some embodiments, the isolation oxide is deposited by such as a HDP CVD process, a HARP, a CVD process, a SACVD process, or another suitable process. In some embodiments, a chemical mechanical polishing (CMP) process may be performed to planarize the upper surface of the STI 114.

Figure 2A:
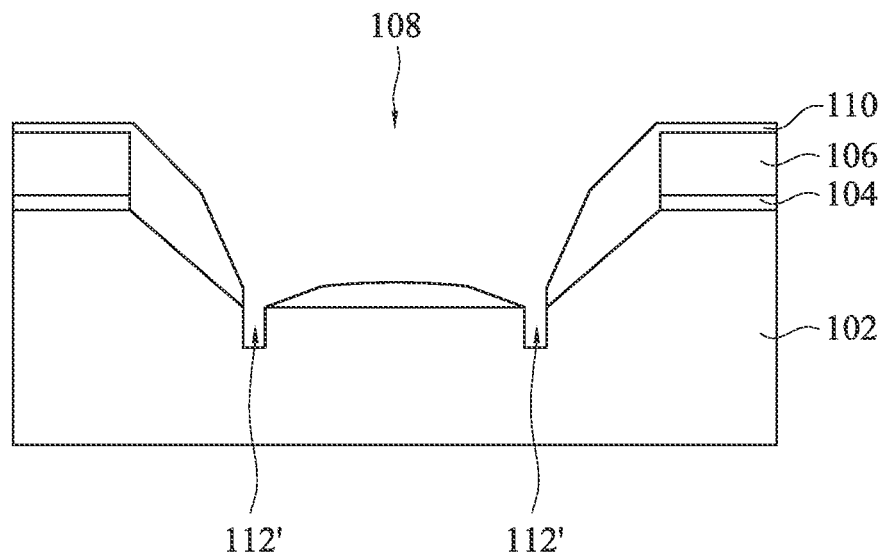
FIG. 2A through FIG. 2B are schematic cross-sectional views of intermediate stages illustrating a method of forming a deep trench of a semiconductor device in accordance with another embodiments.
Figure 2B:
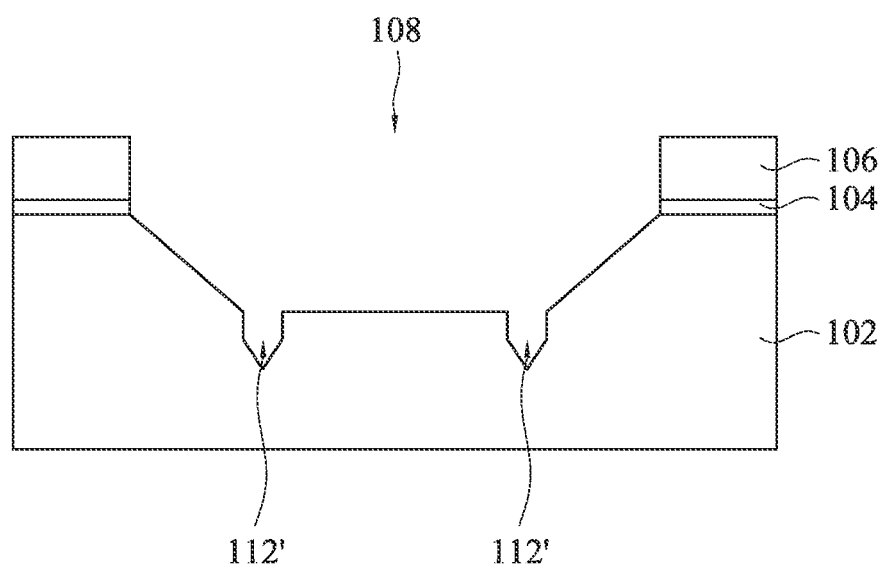

In some embodiments, the deep trench of the semiconductor device 100 may be formed by performing a dry etching process first and a wet etching process after the dry etching process. Referring to FIG. 2A through FIG. 2B, FIG. 2A through FIG. 2B are schematic cross-sectional views of intermediate stages illustrating a method of forming a deep trench of a semiconductor device in accordance with another embodiments. In FIG. 2A, a dry etching process is performed to the protective layer 110. The dry etching process is performed until at least a portion of a bottom surface of the shallow trench 108 is exposed by the protective layer 110. The dry etching process may include a plasma etching process, a sputter etching process, a RIE process, or other suitable process. The dry etching process is performed until at least a portion of a bottom surface of the shallow trench 108 is exposed by the protective layer 100. As shown in FIG. 2A, the periphery area of the bottom surface of the shallow trench 108 is exposed. In various embodiments, the exposed area may be at center position of the bottom surface of the shallow trench 108, or another position, in accordance with various requirements. After the dry etching process, a deep trench 112' is formed below the bottom surface of the shallow trench 108. However, the dry etching process may cause damage to the semiconductor substrate 102. For example, the plasma etching process may cause crystal defects or dislocations of the semiconductor substrate 102 the bottom face and the side face of the deep trench 112'.

Next, as shown in FIG. 2B, a wet etching process is performed to deeper the deep trench 112'. The wet etching process may be isotropic or anisotropic. The enchant used for the etching process may be selected in accordance with the material of the semiconductor substrate 102. After the wet etching process, the bottom face and the side face of the deep trench 112' with defects (crystal defects and/or dislocations) are removed from the semiconductor substrate 102, thereby improving yield rate of the semiconductor device 100.

Note that, the deep trench 112' shown in FIG. 2B is for illustrative purposes only and is not meant to limit the scope of the present disclosure. The shape, width and location of the deep trench 112' may be determined by the pattern of the protective layer 110, and the thickness of the deep trench 112' may be determined by the time duration of the wet etching process. In some embodiments, the deep trench 112' is formed having the thickness of at least 1000 angstroms. In some embodiments, a thickness ratio of the STI 114 to the deep trench 112' is about 0.5 to about 10.

Figure 3:
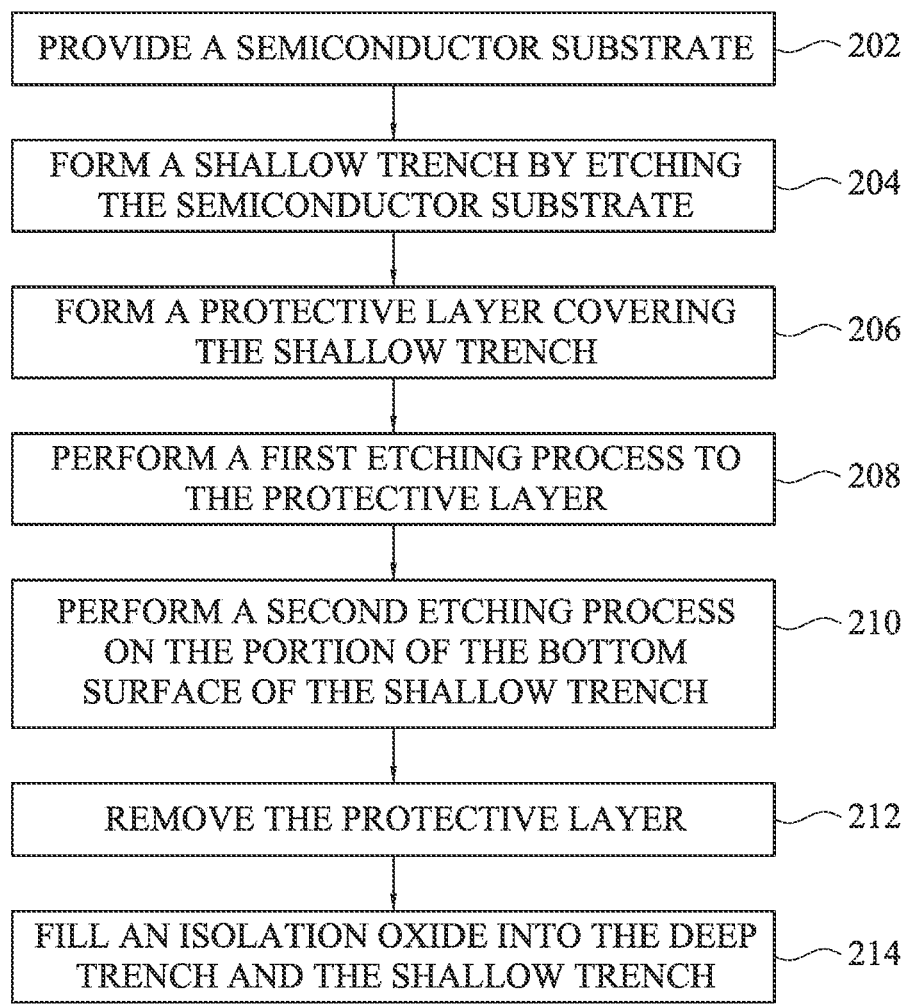
FIG. 3 is a flow chart of a method of forming a semiconductor substrate in accordance with various embodiments.

Referring to FIG. 3 in conjunction with FIG. 1A to FIG. 1H, FIG. 3 is a flow chart of a method 200 for fabricating a semiconductor device 100 in accordance with some embodiments. The method 200 begins at operation 202, where a semiconductor substrate 102 is provided. In some embodiments, the semiconductor substrate 102 includes such as silicon, bulk silicon, germanium or diamond. In another embodiments, the semiconductor substrate 102 may include a compound semiconductor such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. In addition, the semiconductor substrate 102 may be a bulk substrate or a SOI substrate. Further, a pad layer 104 is formed on the semiconductor substrate 102, and a barrier layer 106 is formed on the pad layer 104. In some embodiments, the pad layer 104 includes such silicon oxide, and is formed by such as a CVD process, a thermal oxidation process, or another suitable process. The barrier layer 106 includes such as silicon nitride, and is formed by such as a CVD process, a LPCVD process, a PECVD process, or another suitable process.

At operation 204, an etching process is performed to etch the barrier layer 106, the pad layer 104 and the semiconductor substrate 102 by using a patterned photoresist layer (not shown) as a mask, so as to form a shallow trench 108 through the pad layer 104, the barrier layer 106 and a portion of the semiconductor substrate 102. In some embodiments, the etching process for forming the shallow trench 108 includes such as an anisotropic etching process, an isotropic etching process, or another suitable etching process. After the etching process, the patterned photoresist layer (not shown) is stripped.

At operation 206, a protective layer 110 is formed on the semiconductor substrate 102, the pad layer 104 and the barrier layer 106 for covering the shallow trench 108. The protective layer 110 may include a material such as silicon oxide, silicon nitride, silicon oxynitride, silicon carbide, combinations thereof, and/or the like. The protective layer 110 may be a hard mask layer, and may be a single-layer or multi-layer structure. In some embodiments, the protective layer 110 is a two-layer structure, which includes an oxide layer and a nitride layer on the oxide layer. The protective layer 110 is formed by using one or more deposition processes, such as CVD process, PECVD process, HDPCVD process, PVD process, ALD process, thermal oxidation process, combinations thereof, and/or the like.

At operation 208, a first etching process is performed to the protective layer 110. The first etching process is performed until at least a portion of a bottom surface of the shallow trench 108 is exposed by the protective layer 110. The first etching process is performed until at least a portion of a bottom surface of the shallow trench 108 is exposed by the protective layer 100. The first etching process may include such as a dry etching process, a wet etching process, a plasma etching process, a reactive ion etching process, or another suitable etching process.

At operation 210, a second etching process is then performed on the portion of the bottom surface of the shallow trench 108. The protective layer 110 remained after the first etching process is used for protecting the other portion of the shallow trench 108 from being etched during the second etching process. The second etching process may include such as a dry etching process, a wet etching process, a RIE process, or another suitable process. After the second etching process, a deep trench 112 is formed below the bottom surface of the shallow trench 108. The shape, width and location of the deep trench 112 may be determined by the pattern of the protective layer 110, and the thickness of the deep trench 112 may be determined by the time duration of the second etching process. In some embodiments, the deep trench 112 is formed having the thickness of at least 1000 angstroms.

At operation 212, after the deep trench 112 is formed, the remaining protective layer 110, the barrier layer 106 and the pad layer 104 are removed. The applied removing process may include one or more etching processes, such as wet etching process, dry etching process, combinations thereof, or another suitable process.

At operation 214, the shallow trench 108 and the deep trench 112 are filled with an isolation oxide, so as to form a STI 114 and a DTI 116 respectively. In some embodiments, the isolation oxide includes a material such as silicon oxide, silicon dioxide, carbon doped silicon dioxide, nitrogen doped silicon dioxide, germanium doped silicon dioxide, phosphorus doped silicon dioxide, combinations thereof, or the like. In some embodiments, a deposition process, such as HDP CVD process, HARP, CVD process, SACVD process, or another suitable process, is perform to fill the isolation oxide into the shallow trench 108 and the deep trench 112. In some embodiments, a CMP process may be performed to planarize the upper surface of the STI 114.

Figure 4A:
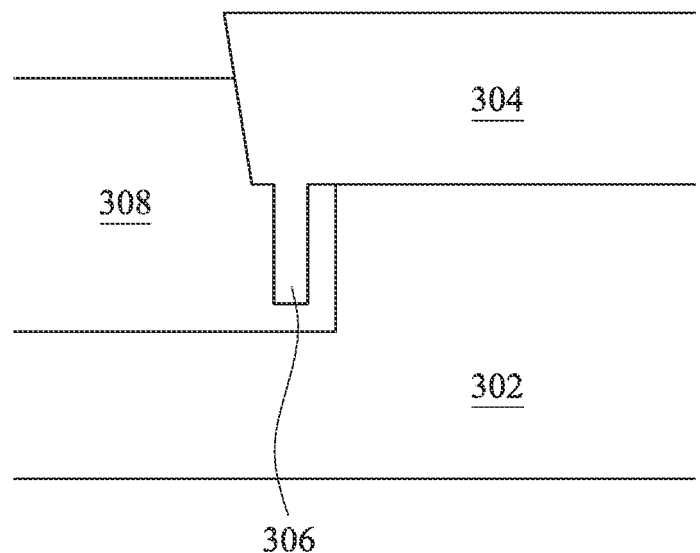
FIG. 4A through FIG. 4C are schematic cross-sectional views of intermediate stages illustrating a method of forming a semiconductor device in accordance with some embodiments.
Figure 4B:
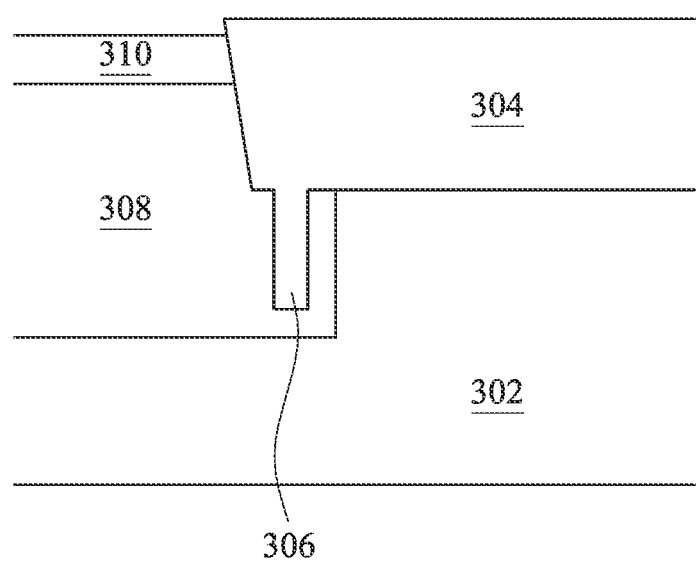
Figure 4C:
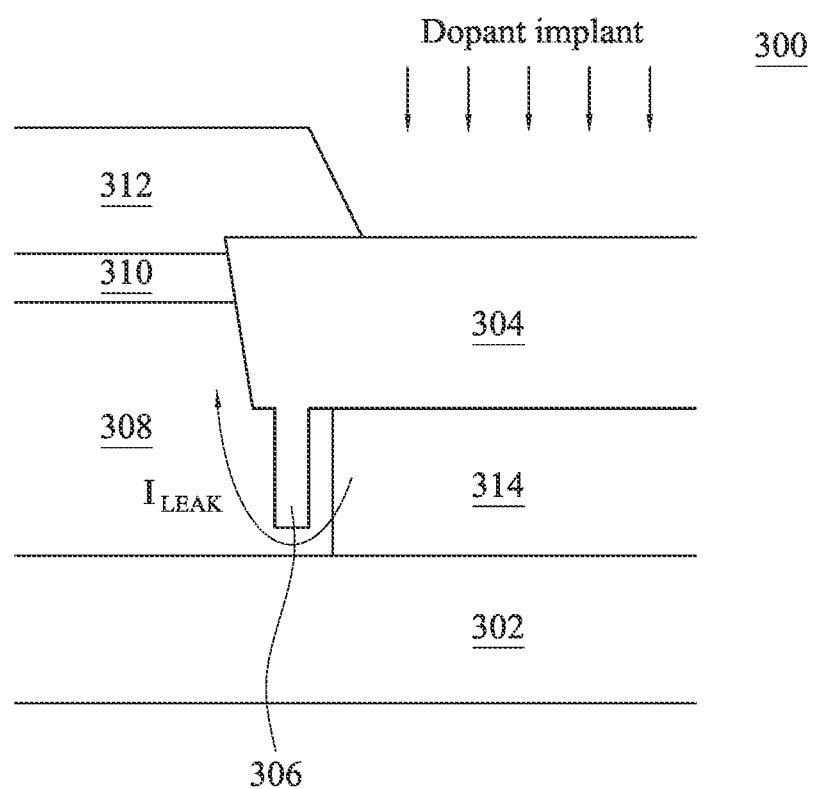

Referring to FIG. 4A to FIG. 4C, FIG. 4A to FIG. 4C illustrate schematic cross-sectional views of intermediate stages showing a method of forming a semiconductor device 300 in accordance with some embodiments of the present disclosure. In FIG. 4A, a semiconductor substrate 302, a STI 304 and a DTI 306 are provided, and a well region 308 is formed on the semiconductor substrate 302. The semiconductor substrate 302, the STI 304 and the DTI 306 may be the semiconductor substrate 102, the STI 114 and the DTI 116 shown in FIG. 1H, respectively. The semiconductor substrate 302 may be a P-type or N-type semiconductor substrate. The conductive type of the well region 308 may be P-type or N-type. For example, the dopant for implanting into the well region 308 may include boron for P-type well region, or phosphorous and/or arsenic for an N-type well region. The well region 308 may be a high voltage well with dopant concentration of between $10^{13}$ atoms/cm$^2$ and $10^{16}$ atoms/cm$^2$, for example. The well region 308 may be formed by a process such as ion implantation process, diffusion process, or the like. As shown in FIG. 4A, the DTI 306 is located in the well region 308 after the well region 308 is formed.

In FIG. 4B, an active region 310 is formed on the well region 308. The active region 310 may be formed by a process such as ion implantation process, diffusion process, or another suitable process. The conductive type of the active region 310 is different from that of the well region 308. For example, the active region 310 is P-type while the well region 308 is N-type.

In FIG. 4C, a photoresist 312 is formed on the active region 310, and an ion implantation process is performed through the STI 304 to form a well region 314 on the semiconductor substrate 302 and laterally adjacent to the well region 308. The photoresist 312 may be a positive photoresist or a negative photoresist, which is used for protecting the active region 310 from being damaged by the subsequent ion implantation processes. The conductive type of the well region 314 is the same as the active region 310, and is different from that of the well region 308. For example, the well region 314 and the active region 310 are P-type, and the well region 308 is N-type. In some alternative embodiments, the well region 314 and the active region 310 are N-type, and the well region 308 is P-type. As shown in FIG. 4C, after the well region 314 is formed, the DTI 306 is located in the well region 308 and near to the boundary between the well regions 308 and 314. In other words, the DTI 306 is located between the well region 314 and a majority of the well region 308. As can be seen from FIG. 4C, because the leakage current $I_{LEAK}$ can not pass through the DTI 306, the path of the leakage current $I_{LEAK}$ from the well region 314 toward the active region 310 is lengthened, such that the leakage current $I_{LEAK}$ can be reduced.

Figure 5:
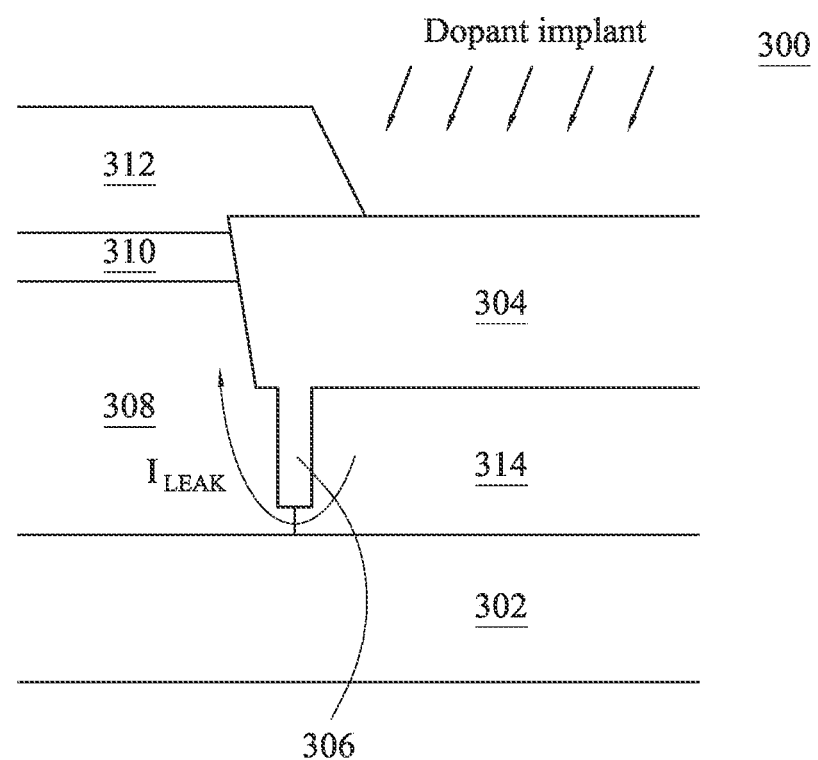
FIG. 5 illustrates formation of a well region using an ion implantation process with non-zero tilting angle in accordance with some embodiments.

FIG. 4C illustrates the ion implantation process is performed with a tilting angle of zero. However, the tilting angle of the ion implantation process may be up to 7 degrees for fabricating semiconductor substrate 300 at the periphery area of the wafer. FIG. 5 illustrates formation of the well region 314 using the ion implantation process with non-zero tilting angle in accordance with some embodiments. As shown in FIG. 5, after the ion implantation process, the well region 314 is formed, such that the DTI 306 is located at the boundary between the well regions 308 and 314. As can be seen from FIG. 5, the path of the leakage current $I_{LEAK}$ from the well region 314 toward the active region 310 is lengthened because of the DTI 306 and, therefore, the leakage current $I_{LEAK}$ can be reduced in a similar manner as described above with reference to FIG. 4C.

Alternatively, the DTI 306 may be located in the well region 314 and near to the boundary between the well regions 308 and 314. Such structure also helps lengthen the path of the leakage current $I_{LEAK}$ from the well region 314 toward the active region 310, thus reducing the leakage current $I_{LEAK}$.

Figure 6:
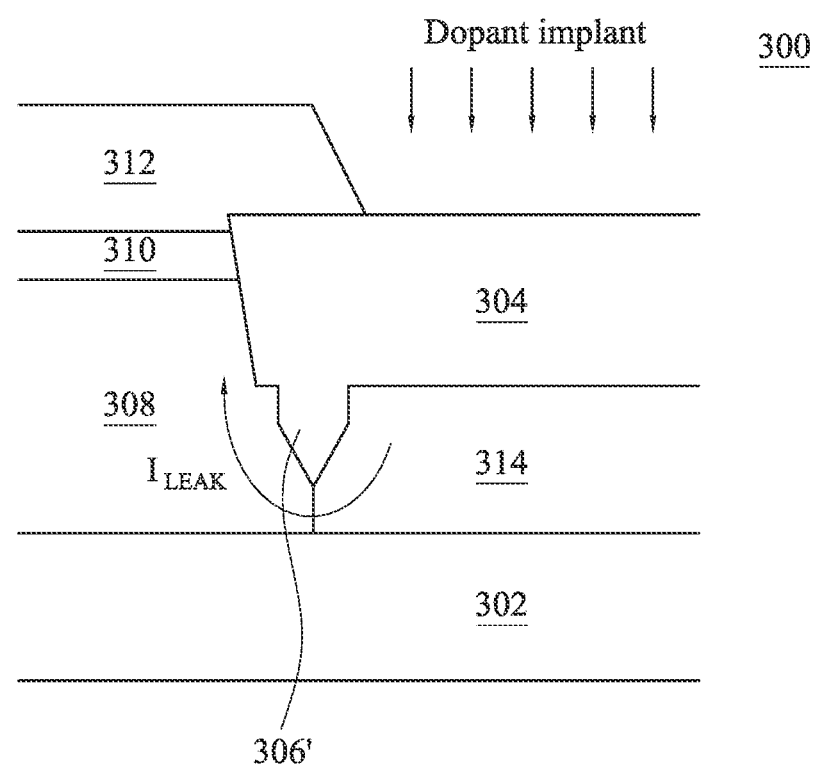
FIG. 6 illustrates formation of a well region using an ion implantation process in accordance with some embodiments.

FIG. 6 illustrates formation of a well region using an ion implantation process in accordance with some embodiments. The DTI 306' shown in FIG. 6 is formed corresponding to the deep trench 112' shown in FIG. 2B. As shown in FIG. 6, after the ion implantation process, the well region 314 is formed, such that the DTI 306' is located at the boundary between the well regions 308 and 314. As can be seen from FIG. 6, the path of the leakage current $I_{LEAK}$ from the well region 314 toward the active region 310 is lengthened because of the DTI 306' and, therefore, the leakage current $I_{LEAK}$ can be reduced.

The semiconductor structure of the present disclosure can reduce leakage current through well regions. For example, memory integrated circuits (e.g., flash memory chips) with such semiconductor structure can reduce power consumption or even reduce read/write error. As such, defects of the memory integrated circuits can be reduced. It should be noted that, the semiconductor structure of the present disclosure may be applied to other types of integrated circuits as well, such as CMOS image sensors, temperature sensors, and/or the like.

Figure 7:
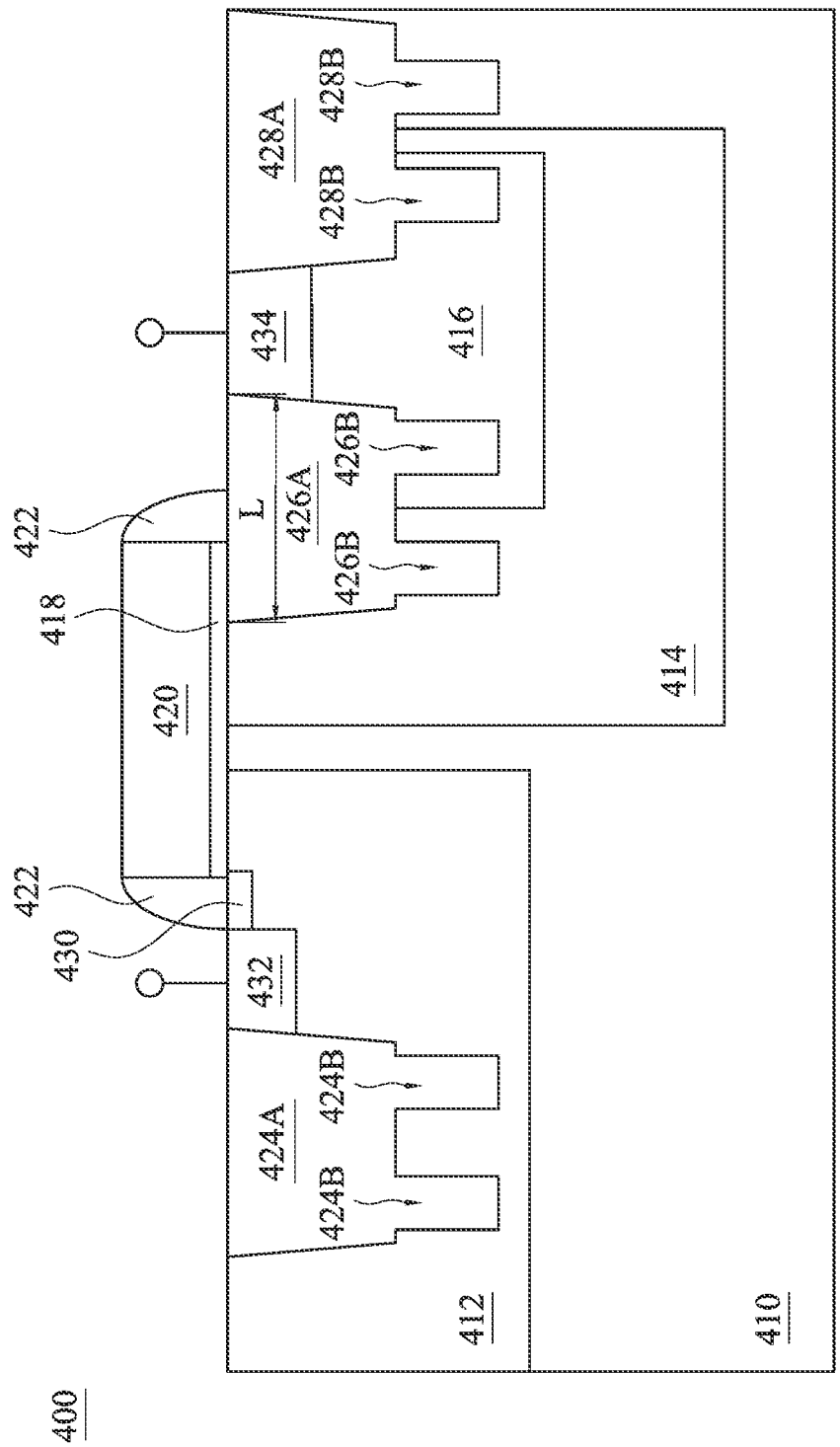
FIG. 7 is a schematic cross-sectional view of a laterally diffused metal oxide semiconductor (LDMOS) in accordance with some embodiments.

Referring to FIG. 7, FIG. 7 is a schematic cross-sectional view of a semiconductor structure 400 in accordance with some embodiments. The semiconductor structure 400 may a laterally diffused metal oxide semiconductor (LDMOS), a vertical diffused metal oxide semiconductor (VDMOS), or the like. In a case that the semiconductor structure 400 is a N-type LDMOS, a P-type implant region 412 is formed on a P-type semiconductor substrate 410, and a N-type well region 414 is formed on the semiconductor substrate 410 and adjacent to the P-type implant region 412. A N-type implant region 416 is formed in the N-type well region 414. A gate dielectric 418 and a gate electrode 420 are sequentially formed on the substrate 410, the P-type implant region 412 and the N-type well region 414. The gate electrode 420 may be a conductive gate structure, such as polysilicon gate structure, metal gate structure or other suitable gate electrode. A gate spacer 422 is formed on sidewalls of the gate dielectric 418 and the gate electrode 420. A STI 424A is formed on the P-type implant region 412, STIs 426A and 428A are formed on the N-type well region 414 and the N-type implant region 416, and DTIs 424B, 426B and 428B are formed below the STIs 424A, 426A and 428A, respectively. The STIs 424A, 426A and 428A and the DTIs 424B, 426B and 428B may be similar to the STI 114 and the DTI 116 in FIG. 1H respectively. The lightly doped drain (LDD) region 430 is formed in the P-type implant region 412 and below the gate spacer 422. The source/drain electrode 432 is formed between the STI 424A and the LDD region 430, and the source/drain electrode 434 is formed between the STIs 426A and 428A.

Whereas, in a case that the semiconductor structure 400 is a P-type LDMOS, a N-type implant region 412 is formed on a N-type semiconductor substrate 410, and a P-type well region 414 is formed on the substrate and adjacent to the N-type implant region 412. A P-type implant region 416 is formed in the P-type well region 414. A gate dielectric 418 and a gate electrode 420 are sequentially formed on the N-type semiconductor substrate 410, the N-type implant region 412 and the P-type well region 414. A gate spacer 422 is formed on sidewalls of the gate dielectric 418 and the gate electrode 420. A STI 424A is formed on the N-type implant region 412, STIs 426A and 428A are formed on the P-type well region 414 and the P-type implant region 416, and DTIs 424B, 426B and 428B are formed below the STIs 424A, 426A and 428A, respectively. The lightly doped drain (LDD) region 430 is formed in the N-type implant region 412 and below the gate spacer 422. The source/drain electrode 432 is formed between the STI 424A and the LDD region 430, and the source/drain electrode 434 is formed between the STIs 426A and 428A.

TABLE 1

| Model | STI Width (μm) | Breakdown Voltage (V) | Drain-Source On-State Resistance (mΩ × mm²) | Power Consumption (Fixed Current) |
|---|---|---|---|---|
| LDMOS with DTI | 1.5 | 55.8 | 24.8 | 24.8 |
| | 1.8 | 58 | 29.3 | 29.3 |
| | 2 | 59.3 | 32.2 | 32.2 |
| | 2.3 | 59.5 | 36.6 | 36.6 |
| LDMOS without DTI | 2.3 | 54.8 | 28.5 | 28.5 |

TABLE 1 lists experiential results of LDMOS structures with and without DTI. The LDMOS structure with DTI is the semiconductor structure 400 in the FIG. 7. The structure without DTI is similar to the semiconductor structure 400 except that no DTIs are included. As listed in TABLE 1, for the same STI width (the width L of the STI 426A in FIG. 7) of 2.3 μm, the breakdown voltage of the LDMOS with DTI is greater than that of the LDMOS without DTI, and the drain-source on-state resistance (Rdson) of the LDMOS with DTI is greater than that of the LDMOS without DTI. Because of the DTIs 426B, the current path from the source/drain electrode 434 to the source/drain electrode 432 is lengthened, such that the drain-source on-state resistance increases accordingly. If the width of the LDMOS with DTI is narrowed from 2.3 μm to 1.5 μm, the breakdown voltage decreases from 59.5 V to 55.8 V, which is still greater than that of the LDMOS without DTI, and the power consumption of the LDMOS with DTI decreases from 28.5 to 24.8, which becomes lower than that of the LDMOS without DTI. As can been from the above, the DTI helps increase the breakdown voltage the LDMOS and narrow the STI width of the LDMOS, thereby saving the size of the LDMOS.

Figure 8:
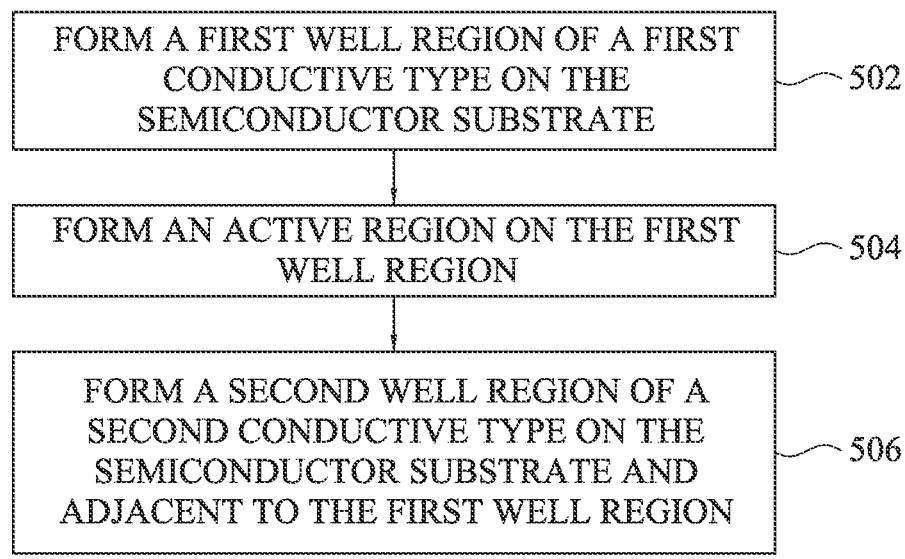
FIG. 8 is a flow chart of a method of forming a semiconductor device in accordance with various embodiments.

Referring to FIG. 8 in conjunction with FIG. 4A to FIG. 4C, FIG. 8 is a flow chart of a method 500 for fabricating a semiconductor device in accordance with some embodiments. The method 500 begins at operation 502, where a semiconductor substrate 302, a STI 304 and a DTI 306 are provided, and a well region 308 is formed on the semiconductor substrate 302. The semiconductor substrate 302 may be a P-type or N-type semiconductor substrate. The well region 308 has a first conductive type, which may be P-type or N-type, for example. The well region 308 may be formed by a process such as ion implantation process, diffusion process, or the like. After the well region 308 is formed, the DTI 306 is located in the well region 308.

At operation 504, an active region 310 is formed on the well region 308. The active region 310 may be formed by a process such as ion implantation process, diffusion process, or another suitable process. The active region 310 has a conductive type is different from the first conductive type of the well region 308. For example, the conductive type of the active region 310 is P-type if the first conductive type is N-type.

At operation 506, a well region 314 of a second conductive type is formed on the semiconductor substrate 302 and laterally adjacent to the well region 308. In detail, a photoresist 312 may be formed on the active region 310 for protecting the active region 310 from being damaged by the subsequent processes. Next, an ion implantation process is performed to form the well region 314. The second conductive type of the well region 314 is the same as the conductive type of the active region 310, and is different from the first conductive type of the well region 308. For example, the second conductive type of the well region 314 and the conductive type of the active region 310 are P-type, and the first conductive type of the well region 308 is N-type. As shown in FIG. 4C, after the well region 314 is formed by the ion implantation process with a tilting angle of zero, the DTI 306 is located in the well region 308 and near to the boundary between the well regions 308 and 314. In other words, the DTI 306 is located between the well region 314 and a majority of the well region 308.

In a case that the well region 314 is formed by the ion implantation process with non-zero tilting angle, as shown in FIG. 5, after the well region 314 is formed, the DTI 306 is located at the boundary between the well regions 308 and 314. Alternatively, the DTI 306 may be located in the well region 314 and near to the boundary between the well regions 308 and 314.

In accordance with some embodiments, an LDMOS device comprises a well region, a first implant region, a second implant region, a gate electrode, a first source/drain region, a second source/drain region, a first STI region, and a first DTI region. The well region is in a substrate and is of a first conductivity type. The first implant region is in the substrate and is of a second conductivity type opposite the first conductivity type. The second implant region is in the well region and is of the first conductivity type. The gate electrode extends from above the well region to above the first implant region. The first source/drain region is in the first implant region. The second source/drain region is in the second implant region. The first STI region laterally extends from the second implant region to directly below the gate electrode. The first DTI region extends downwards from a bottom surface of the first STI region into the well region. The first DTI region vertically overlaps with the gate electrode.

In accordance with some embodiments, an LDMOS device includes a well region, first and second implant regions, a gate electrode, first and second source/drain regions, first and second gate spacers, a first STI region, and first and second DTI regions. The well region is in a substrate and is of a first conductivity type. The first implant region is laterally spaced apart from the well region. The first implant region is of a second conductivity type opposite the first conductivity type. The second implant region is in the well region and being of the first conductivity type. The gate electrode is over the well region and the first implant region. The first source/drain region is in the first implant region. The second source/drain region is in the second implant region. The first gate spacer is between a first side of the gate electrode and the first source/drain region. The second gate spacer is between a second side of the gate electrode and the second source/drain region. The first STI region is directly below the second gate spacer. The first and second DTI regions protrude from a bottom surface of the first STI region. A portion of the bottom surface of the first STI region laterally between the first and second DTI regions overlaps the second gate spacer.

In accordance with some embodiments, an LDMOS device comprises a well region, first and second implant regions, a gate electrode, first and second source/drain regions, and an isolation region. The well region is in a substrate. The well region is of a first conductivity type. The first implant region is in the substrate and is of a second conductivity type opposite the first conductivity type. The second implant region is in the well region and is of the first conductivity type. The gate electrode extends from above the well region to above the first implant region. The first source/drain region is in the first implant region. The second source/drain region is in the second implant region. The isolation region is in the well region and the second implant region. The isolation region has a first stepped sidewall structure comprising a first upper sidewall, a first lower sidewall laterally set back from the first upper sidewall, and a first horizontal surface connecting the first upper sidewall to the first lower sidewall. The first stepped sidewall structure of the isolation region is directly below the gate electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An LDMOS device comprising:
a well region in a substrate, the well region being of a first conductivity type;
a first implant region in the substrate, the first implant region being of a second conductivity type opposite the first conductivity type;
a second implant region in the well region and being of the first conductivity type;
a gate electrode extending from above the well region to above the first implant region;
a first source/drain region in the first implant region;
a second source/drain region in the second implant region;

a first shallow trench isolation (STI) region adjacent to the second source/drain region;
first deep trench isolation (DTI) regions extending downwards from a bottom surface of the first STI region into the well region;
a second STI region in the substrate and adjacent to the first source/drain region; and
second DTI regions extending downwards from a bottom surface of the second STI region into the first implant region.

2. The LDMOS device of claim 1, further comprising:
a third STI region in the substrate and adjacent to the second source/drain region, wherein the second source/drain region is between the first STI region and the third STI region; and
third DTI regions extending downwards from a bottom surface of the third STI region.

3. The LDMOS device of claim 1, wherein one of the first DTI regions extends, at least in part, into the well region and another one of the first DTI regions extends, at least in part, into the second implant region.

4. The LDMOS device of claim 1, wherein a top surface of the first STI region and a top surface of the second STI region are level with a top surface of the first source/drain region and a top surface of the second source/drain region.

5. A laterally diffused metal oxide semiconductor (LDMOS) device comprising:
a well region in a substrate, the well region being of a first conductivity type;
a first implant region in the substrate, the first implant region being of a second conductivity type opposite the first conductivity type;
a second implant region in the well region and being of the first conductivity type;
a gate electrode extending from above the well region to above the first implant region;
a first source/drain region in the first implant region;
a second source/drain region in the second implant region;
a first shallow trench isolation (STI) region on a first side of the second source/drain region and laterally extending from the second implant region to directly below the gate electrode;
first deep trench isolation (DTI) regions extending downwards from a bottom surface of the first STI region into the well region, wherein the first DTI region vertically overlaps with the gate electrode;
a second STI region in the substrate on a second side of the second source/drain region opposite to the first side of the second source/drain region;
second DTI regions extending downwards from a bottom surface of the second STI region;
a third STI region in the substrate and in contact with the first source/drain region; and
third DTI regions extending downwards from a bottom surface of the third STI region.

6. The LDMOS device of claim 5, wherein the second source/drain region has opposite sides respectively in contact with the first STI region and the second STI region.

7. The LDMOS device of claim 5, wherein the second STI region has a top surface level with a top surface of the first implant region.

8. The LDMOS device of claim 5, wherein an entirety of the first STI region is below a bottommost position of the gate electrode.

9. The LDMOS device of claim 5, wherein the first, second, and third DTI regions are made of germanium doped silicon dioxide or carbon doped silicon dioxide.

10. The LDMOS device of claim 5, further comprising a lightly doped region in the substrate and in contact with the first source/drain region, wherein the first source/drain region is between the lightly doped region and the third STI region.

11. The LDMOS device of claim 5, wherein the third DTI regions extend into the first implant region.

12. The LDMOS device of claim 11, wherein one of the first DTI regions extends into the well region and another one of the first DTI regions extends into the second implant region.

13. The LDMOS device of claim 12, wherein one of the second DTI regions extends into the second implant region, and another one of the second DTI regions extends into the substrate.

14. The LDMOS device of claim 5, further comprising a gate dielectric layer extending to a top surface of the first STI region.

15. The LDMOS device of claim 14, wherein the gate dielectric layer forms an interface with the top surface of the first STI region.

16. The LDMOS device of claim 5, wherein a top surface of the first STI region, a top surface of the second STI region, and a top surface of the third STI region are level with a top surface of the substrate.

17. The LDMOS device of claim 5, wherein the first implant region is laterally spaced apart from the well region.

18. An LDMOS device comprising:
a well region in a substrate, the well region being of a first conductivity type;
a first implant region laterally spaced apart from the well region, the first implant region being of a second conductivity type opposite the first conductivity type;
a second implant region in the well region and being of the first conductivity type;
a gate electrode over the well region and the first implant region;
a first source/drain region in the first implant region;
a second source/drain region in the second implant region;
a first gate spacer between a first side of the gate electrode and the first source/drain region;
a second gate spacer between a second side of the gate electrode and the second source/drain region;
a first STI region directly below the second gate spacer and on a first side of the second source/drain region;
first DTI regions protruding from a bottom surface of the first STI region, wherein one of the first DTI regions is directly below the gate electrode, wherein the first DTI regions are made of germanium doped silicon dioxide or carbon doped silicon dioxide;
a second STI region in the substrate on a second side of the second source/drain region opposite to the first side of the second source/drain region;
second DTI regions extending downwards from a bottom surface of the second STI region;
a third STI region in the substrate and in contact with the first source/drain region; and
third DTI regions extending downwards from a bottom surface of the third STI region.

19. The LDMOS device of claim 18, wherein a vertical interface formed by the well region and the second implant region extends a longer length in a vertical direction than a sidewall of the first DTI regions.

20. The LDMOS device of claim 18, wherein a vertical interface formed by the well region and the second implant region has a top level with a top of the first DTI regions, and a bottom lower than a bottom of the first DTI regions.

* * * * *